United States Patent
Ohido

(10) Patent No.: US 7,828,895 B2
(45) Date of Patent: *Nov. 9, 2010

(54) METHOD OF PRODUCING OPTICAL ELEMENT

(75) Inventor: Atsushi Ohido, Tokyo (JP)

(73) Assignee: TDK Corporation, Tokyo (JP)

( * ) Notice: Subject to any disclaimer, the term of this patent is extended or adjusted under 35 U.S.C. 154(b) by 103 days.

This patent is subject to a terminal disclaimer.

(21) Appl. No.: 11/655,070

(22) Filed: Jan. 19, 2007

(65) Prior Publication Data

US 2007/0193506 A1  Aug. 23, 2007

(30) Foreign Application Priority Data

Jan. 27, 2006 (JP) ............... 2006-018932
Nov. 21, 2006 (JP) ............... 2006-314087

(51) Int. Cl.
  *C30B 29/16* (2006.01)
(52) U.S. Cl. ............... 117/45; 117/46; 117/50; 117/72; 117/75
(58) Field of Classification Search ............... 117/45, 117/46, 50, 75, 72
  See application file for complete search history.

(56) References Cited

U.S. PATENT DOCUMENTS

| | | | |
|---|---|---|---|
| 4,077,832 A | 3/1978 | Robertson et al. | |
| 4,402,787 A | 9/1983 | Matsuzawa et al. | |
| 4,444,615 A | 4/1984 | Matsuzawa et al. | |
| 4,519,870 A | 5/1985 | Matsuzawa et al. | |
| 4,698,820 A | 10/1987 | Brandle et al. | |
| 5,920,420 A | 7/1999 | Ishikura et al. | |
| 6,059,878 A | 5/2000 | Takeda et al. | |
| 6,527,973 B2 | 3/2003 | Ohido et al. | |
| 6,775,052 B2 | 8/2004 | Sugawara et al. | |
| 6,853,473 B2 | 2/2005 | Ohido et al. | |
| 6,875,270 B2 | 4/2005 | Ohido et al. | |
| 7,022,303 B2 | 4/2006 | Riman et al. | |
| 7,133,189 B2 | 11/2006 | Ohido et al. | |
| 7,187,496 B2 | 3/2007 | Sugawara et al. | |
| 7,242,516 B2 | 7/2007 | Sugawara et al. | |

(Continued)

FOREIGN PATENT DOCUMENTS

CN  1439749 A  9/2003

(Continued)

OTHER PUBLICATIONS

J.H. Park, "Growth of Epitaxial Garnet Film by LPE for Application to Integrated Magneto-Optic Light Switch Arrays", Phys. Stat. Sol., vol. 201, No. 8, Jun. 2004, pp. 1976-1979.

(Continued)

*Primary Examiner*—Robert M Kunemund
(74) *Attorney, Agent, or Firm*—Oliff & Berridge, PLC

(57) ABSTRACT

The invention relates to a method of producing an optical element using a garnet single crystal for the purpose of providing an optical element with a reduced Pb content or from which Pb can preliminarily be removed completely. By growing a garnet single crystal by using a solution containing Na, Bi and B by the LPE process and thermally treating the garnet single crystal in reducing atmosphere prepared by using nitrogen gas and/or hydrogen gas, the resulting thermally treated garnet single crystal is used to prepare an optical element.

7 Claims, 1 Drawing Sheet

U.S. PATENT DOCUMENTS

| | | | |
|---|---|---|---|
| 7,280,264 | B2 | 10/2007 | Goto et al. |
| 7,333,261 | B2 | 2/2008 | Ohido et al. |
| 7,517,406 | B2 | 4/2009 | Ohido et al. |
| 2003/0211369 | A1 | 11/2003 | Riman et al. |
| 2003/0219261 | A1 | 11/2003 | Ohido et al. |
| 2006/0112873 | A1 | 6/2006 | Uchida et al. |
| 2007/0002425 | A1 | 1/2007 | Goto et al. |
| 2007/0160875 | A1* | 7/2007 | Ohido .................... 428/822.2 |
| 2007/0193504 | A1 | 8/2007 | Ohido |
| 2008/0095686 | A1* | 4/2008 | Ohido ...................... 423/263 |
| 2009/0294682 | A1 | 12/2009 | Perna |
| 2009/0294683 | A1 | 12/2009 | Perna |

FOREIGN PATENT DOCUMENTS

| | | |
|---|---|---|
| DE | 2 318 798 | 10/1973 |
| EP | 0 208 476 A2 | 1/1987 |
| JP | B-57-045719 | 9/1982 |
| JP | B 57-45719 | 9/1982 |
| JP | A 62-143893 | 6/1987 |
| JP | B2-06-046604 | 6/1994 |
| JP | A 09-202697 | 8/1997 |
| JP | A-10-072296 | 3/1998 |
| JP | A-2000-086396 | 3/2000 |
| JP | A 2001-044026 | 2/2001 |
| JP | A-2001-044026 | 2/2001 |
| JP | A 2001-044027 | 2/2001 |
| JP | A-2001-044027 | 2/2001 |
| JP | A 2003-306397 | 10/2003 |
| JP | A 2004-83390 | 3/2004 |
| JP | A-2004-083390 | 3/2004 |
| JP | A-2004-269305 | 9/2004 |
| JP | A-2006-169093 | 6/2006 |
| JP | A 2006-169093 | 6/2006 |
| WO | WO 2005/056887 A1 | 6/2005 |
| WO | WO 2006/054628 A1 | 5/2006 |

OTHER PUBLICATIONS

J. H. Park et al., "Growth of Epitaxial Garnet Film by LPE for Application to Integrated Magneto-Optic Light Switch Arrays" Phys. Stat. Sol., vol. 201, No. 8, 2004, pp. 1976-1979.

Robertson, J.M.; "Improvement of Lead-Free Flux Systems for the Growth of Bismuth-Substituted Iron Garnet Films by Liquid Phase Epitaxy," *Journal of the Electrochemical Society*; vol. 123, No. 8; Aug. 1976; pp. 1248-1249.

Feb. 24, 2010 Office Action issued in U.S. Appl. No. 11/704,192.

European Search Report issued May 17, 2010 in Application No. EP 07 00 1472.

Office Action issued Jun. 23, 2010 in U.S. Appl. No. 11/704,192.

* cited by examiner

METHOD OF PRODUCING OPTICAL ELEMENT

BACKGROUND OF THE INVENTION

1. Field of the Invention

The present invention relates to a method of producing an optical element using a garnet single crystal.

2. Description of the Related Art

Faraday rotator is an optical element with a function to rotate the polarization plane of transmitting light and is used in optical devices such as optical isolator and optical circulator for communication. Faraday rotator is generally prepared by using a plane-like bismuth (Bi)-substituted rare-earth iron garnet single crystal. The Bi-substituted rare-earth iron garnet single crystal is prepared by the liquid phase epitaxial (LPE) process as one of flux processes.

In growing the Bi-substituted rare-earth iron garnet single crystal by the LPE process, generally, lead oxide (PbO), bismuth oxide ($Bi_2O_3$) and boron oxide ($B_2O_3$) are used as the solvents so as to stably grow the garnet single crystal while the solvents are maintained at the supersaturation states. During the growth of the magnetic garnet single crystal, therefore, a small amount of lead (Pb) contaminates in the resulting crystal. In Faraday rotators for use in optical devices for communication, magnetic garnet single crystals at a Pb content "y" of about 0.03 to 0.06 in the chemical formula $Bi_{3-x-y}M1_xPb_yFe_{5-z-w}M2_zM3_wO_{12}$ have been used conventionally. See Patent Reference 1: the official gazette of JP-A-2001-044026 and Patent Reference 2: the official gazette of JP-A-2001-044027.

Following the upsurge in the recent environmental protection movement, however, efforts are now directed toward the reduction of the content of Pb as an environmental load substance in any of industrial products. Therefore, a trace amount of contaminating Pb in magnetic garnet single crystals grown by the LPE process draws concerns as a factor of environmental pollution. Therefore, it is necessary to reduce or eliminate the amount of Pb contained in magnetic garnet single crystals as materials constituting optical elements as such Faraday rotators.

SUMMARY OF THE INVENTION

It is an object of the present invention to provide a method of producing an optical element at a reduced Pb content.

The object is attained by a method of producing an optical element comprising growing a garnet single crystal by using a solution containing Na, Bi and B, thermally treating the garnet single crystal in reducing atmosphere, and preparing an optical element by using the thermally treated garnet single crystal.

The method of producing an optical element in accordance with the invention is characteristic in that the reducing atmosphere is generated by using an inactive gas and/or a reducing gas.

The method of producing an optical element in accordance with the invention is characteristic in that the inactive gas includes nitrogen gas.

The method of producing an optical element in accordance with the invention is characteristic in that the reducing gas includes hydrogen gas.

The method of producing an optical element in accordance with the invention is characteristic in that the garnet single crystal contains Na.

The method of producing an optical element in accordance with the invention is characteristic in that the Na in the solution is obtained by melting at least one of NaOH, $Na_2CO_3$, $NaHCO_3$, $NaFeO_2$, $NaBO_2$, $Na_2B_4O_7$, and $NaBiO_3$.

The method of producing an optical element in accordance with the invention is characteristic in that the Na in the solution is obtained by melting at least one of NaOH, $NaHCO_3$, $NaFeO_2$, $NaBO_2$, $Na_2B_4O_7$, and $NaBiO_3$.

In accordance with the invention, the amount of Pb contained in the resulting optical element can be reduced or removed completely.

DESCRIPTION OF THE PREFERRED EMBODIMENTS

Figure 1:
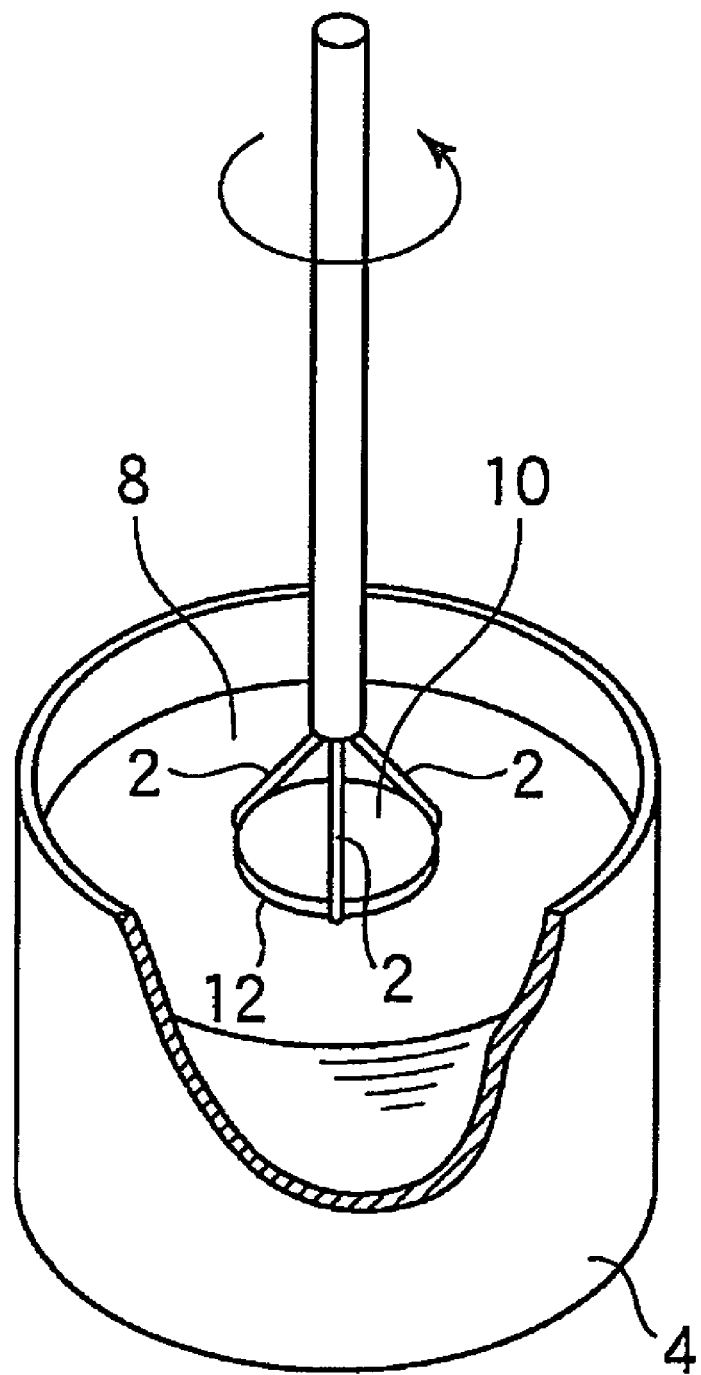
FIG. 1 is a view depicting a part of the single crystal growing process.

First Mode for Carrying out the Invention

A method of producing an optical element in accordance with a first mode for carrying out the invention is now described in FIG. 1. In the present mode, a magnetic garnet single crystal is grown in a solvent containing sodium (Na) after at least a part of Pb contained in conventional solvents is replaced with Na. Compared with other oxides, a great number of substances containing Na and oxygen are dissolved at lower temperatures. Therefore, Na is effective as a solvent for growing magnetic garnet single crystals. A magnetic garnet single crystal grown in a solvent containing for example sodium hydroxide (NaOH) is of an excellent quality without any defects or cracks. By removing PbO from a solvent material and using a Na-containing substance together with $Bi_2O_3$ and $B_2O_3$ as a solvent, a trace amount of Pb contained in conventional magnetic garnet single crystals can be removed almost completely.

It was nonetheless demonstrated that the garnet single crystal grown in Na-containing solvents had very large optical absorption in a wavelength band region of 1300 to 1600 nm for use in optical communication. When garnet single crystals with such large optical absorption are processed to prepare an optical element such as Faraday rotator, disadvantageously, the optical loss (insertion loss) in the resulting optical element is elevated. So as to reduce the optical loss of an optical element from which Pb has preliminarily been removed almost completely, therefore, it is necessary to reduce the optical absorption of garnet single crystals grown with solvents containing Na.

Herein, a Faraday rotator was prepared by processing a magnetic garnet single crystal [$(BiGdYb)_3Fe_5O_{12}$] grown with NaOH, $Bi_2O_3$ and $B_2O_3$ as solvents by the LPE process. The optical loss of the Faraday rotator against the beam at a wavelength of 1.55 μm was 3 dB. Another Faraday rotator was prepared by processing a magnetic garnet single crystal [$(BiGdYb)_3Fe_5O_{12}$] grown with a solvent containing Pb by the LPE process. The optical loss of the resulting Faraday rotator against the beam at a wavelength of 1.55 μm was 0.05 dB or less. It was now shown that the optical loss of the Faraday rotator prepared by using the Na-containing solvent was extremely high compared with the optical loss of the Faraday rotator prepared by using the Pb-containing solvent. The composition of the garnet single crystal prepared by using the Na-containing solvent was examined by X-ray fluorescence analysis. Na at about 100 to 300 ppm was detected in the garnet single crystal. The cation (positive ion) constituting the Bi-substituted rare-earth iron garnet is essentially trivalent. When the Na cation of monovalence as a stable valence number enters in a garnet single crystal, the charge balance is deteriorated so that the resulting garnet single crystal becomes a semiconductor. This indicates the occurrence of optical absorption in the Na-containing garnet single crystal.

In this mode, a garnet single crystal was grown in a solvent containing Na, which was then thermally treated under controls of the atmosphere. Specifically, a Bi-substituted rare-earth iron garnet single crystal was first grown on a single crystal substrate by the LPE process, by using a solvent containing Na, Bi and B. Subsequently, the single crystal substrate was removed by polishing, to prepare a garnet single crystal plate. Then, the garnet single crystal plate was thermally treated in reducing atmosphere at a relatively small oxygen content. Herein, the reducing atmosphere was generated by using an inactive gas, a reducing gas, or a mixture gas of an inactive gas with a reducing gas. As the inactive gas, for example, nitrogen gas and argon gas are used. As the reducing gas, for example, hydrogen gas and carbon monooxide gas are used. The optical absorption of the garnet single crystal plate thermally treated in the reducing atmosphere was examined. The reduction of the optical absorption was confirmed. Furthermore, the garnet single crystal plate was processed to prepare a Faraday rotator. The optical loss of the prepared Faraday rotator was examined. Compared with a Faraday rotator from a garnet single crystal without any thermal treatment in the reducing atmosphere, the reduction of the optical loss thereof was confirmed.

The reason why the optical absorption of the garnet single crystal and the optical loss of the resulting Faraday rotator were reduced in accordance with this mode was investigated and studied. It is believed that the garnet single crystal with contaminating Na through the growth in the Na-containing solvent may be a semiconductor of the type P in electron deficiency. In case that an oxide is a semiconductor of the type P, the electron deficiency is resolved when oxygen defects involving partial defects of oxygen atoms occur, so that the oxide may be an insulant. In other words, the garnet single crystal of the semiconductor of the type P is thermally treated in the reducing atmosphere to trigger oxygen defects, so that the garnet single crystal can be prepared as an insulant. It is considered that the optical absorption of the garnet single crystal and the optical loss of the resulting Faraday rotator can be reduced by preparing the garnet single crystal as an insulant in this mode.

In this mode as described above, an optical element is produced by growing a garnet single crystal by for example the LPE method by using a solution containing Na, Bi and B, thermally treating the resulting garnet single crystal in the reducing atmosphere and then using the thermally treated garnet single crystal. In such manner, an optical element at less optical loss can be prepared, in which Pb is preliminarily reduced or removed totally.

The process of producing an optical element in accordance with the mode for carrying out the invention is more specifically described below, using Examples and Comparative Examples.

Example 1

FIG. 1 depicts a part of the process of growing a single crystal in the present Example. $Gd_2O_3$, $Yb_2O_3$, $Fe_2O_3$, $B_2O_3$, $Bi_2O_3$, and NaOH were charged in a total weight of 2.3 kg in a crucible 4 made of gold (Au). The blended Fe ratio was 15.5 mol %. The blended ratios of B, Bi and Na were 7.0 mol %, 51.6 mol % and 25.4 mol %, respectively. Herein, the term "blended ratio" to be used in the specification represents the ratio of each element in molar number occupying the total molar number of elements (Na, Bi, B, Fe, rare-earth elements, and the like) becoming cations in a solution charged in the crucible 4. The crucible 4 with the materials charged therein was arranged in an electric furnace. By melting and agitating the materials in the crucible 4 by raising the furnace temperature to 900° C., a homogenous melt (solution) 8 was generated. Arranging a CaMgZr-substituted GGG (gadolinium·gallium·garnet) [$(GdCa)_3(GaMgZr)_5O_{12}$] single crystal substrate 10 of a 2-inch diameter onto a fixing device 2, the substrate was charged in a furnace. After the temperature of the melt 8 was lowered down to 770° C., a single face of the substrate 10 was put in contact with the melt 8 to allow epitaxial growth for 40 hours. Consequently, a single crystal film 12 of a film thickness of 500 μm was grown. The single crystal was compositionally analyzed by X-ray fluorescence analysis. The composition was $Bi_{1.00}Gd_{1.70}Yb_{0.30}Fe_{5.00}O_{12}$. Then, the composition was examined in detail by the ICP (inductively coupled plasma; high-frequency inductively coupled plasma) analysis. It was shown that the chemical formula of the resulting magnetic garnet single crystal was $(BiGdYb)_{2.998}Na_{0.002}Fe_{5.000}O_{12}$.

By removing the CaMgZr-substituted GGG single crystal substrate 10 by polishing, a Bi-substituted rare-earth iron garnet single crystal plate was obtained. Subsequently, the single crystal plate was thermally treated in reducing atmosphere with 100% nitrogen at 500° C. for 10 hours. Additionally, the single crystal plate was subject to mirror polishing so that the rotation angle thereof toward the beam at a wavelength of 1.55 μm might be 45 deg. Then, a non-reflective film was formed on the polished two faces of the resulting single crystal plate, to prepare a Faraday rotator. 20 samples were taken out of the prepared Faraday rotators to evaluate the optical loss against the beam at a wavelength of 1.55 μm. The optical loss of the Faraday rotator was 0.04 to 0.06 dB. In this Example, a Faraday rotator with no Pb content and with low optical loss as a characteristic profile utilizable in optical devices was obtained.

Example 2

$Gd_2O_3$, $Yb_2O_3$, $Fe_2O_3$, $B_2O_3$, $Bi_2O_3$, and NaOH were charged in a total weight of 2.3 kg in a crucible 4 made of Au. The blended Fe ratio was 15.5 mol %. The blended ratios of B, Bi and Na were 7.0 mol %, 51.6 mol % and 25.4 mol %, respectively. The crucible 4 with the materials charged therein was arranged in an electric furnace. By melting and agitating the materials in the crucible 4 by raising the furnace temperature to 900° C., a homogenous melt 8 was generated. Arranging a CaMgZr-substituted GGG single crystal substrate 10 of a 2-inch diameter onto a fixing device 2, the substrate was charged in a furnace. After the temperature of the melt 8 was lowered down to 770° C., a single face of the substrate 10 was put in contact with the melt 8 to allow epitaxial growth for 40 hours. Consequently, a single crystal film 12 of a film thickness of 500 μm was grown. The single crystal was compositionally analyzed by X-ray fluorescence analysis. The composition was $Bi_{1.00}Gd_{1.70}Yb_{0.30}Fe_{5.00}O_{12}$. Then, the composition was examined in detail by the ICP analysis. It was shown that the chemical formula of the magnetic garnet single crystal was $(BiGdYb)_{2.998}Na_{0.002}Fe_{5.000}O_{12}$.

By removing the CaMgZr-substituted GGG single crystal substrate 10 by polishing, then, a Bi-substituted rare-earth iron garnet single crystal plate was obtained. Subsequently, the single crystal plate was thermally treated in reducing atmosphere with 95% nitrogen and 5% oxygen (in volume ratio) at 650° C. for 20 hours. Additionally, the single crystal plate was polished by wrapping so that the rotation angle thereof toward the beam at a wavelength of 1.55 µm might be 45 deg. Then, a non-reflective film was formed on the polished two faces thereof, to prepare a Faraday rotator. 20 samples were taken out of the prepared Faraday rotators to evaluate the optical loss against the beam at a wavelength of 1.55 µm. The optical loss of the Faraday rotator was 0.04 to 0.06 dB. In this Example, a Faraday rotator with no Pb content and with low optical loss as a characteristic profile utilizable in optical devices was obtained.

Example 3

$Gd_2O_3$, $Yb_2O_3$, $Fe_2O_3$, $B_2O_3$, $Bi_2O_3$, and NaOH were charged in a total weight of 2.3 kg in a crucible 4 made of Au. The blended Fe ratio was 15.5 mol %. The blended ratios of B, Bi and Na were 7.0 mol %, 51.6 mol % and 25.4 mol %, respectively. The crucible 4 with the materials charged therein was arranged in an electric furnace. By melting and agitating the materials in the crucible 4 by raising the furnace temperature to 900° C., a homogenous melt 8 was generated. Arranging a CaMgZr-substituted GGG single crystal substrate 10 of a 2-inch diameter onto a fixing device 2, the substrate was charged in a furnace. After the temperature of the melt 8 was lowered down to 770° C., a single face of the substrate 10 was put in contact with the melt 8 to allow epitaxial growth for 40 hours. Consequently, a single crystal film 12 of a film thickness of 500 µm was grown. The single crystal was compositionally analyzed by X-ray fluorescence analysis. The composition was $Bi_{1.00}Gd_{1.70}Yb_{0.30}Fe_{5.00}O_{12}$. Then, the composition was examined in detail by the ICP analysis. It was shown that the chemical formula of the magnetic garnet single crystal was $(BiGdYb)_{2.998}Na_{0.002}Fe_{5.000}O_{12}$.

By subsequently removing the CaMgZr-substituted GGG single crystal substrate 10 by polishing, a Bi-substituted rare-earth iron garnet single crystal plate was obtained. Subsequently, the single crystal plate was thermally treated in reducing atmosphere with 99.5% nitrogen and 0.5% hydrogen (in volume ratio) at 500° C. for 6 hours. Additionally, the single crystal plate was polished by wrapping so that the rotation angle thereof toward the beam at a wavelength of 1.55 µm might be 45 deg. Then, a non-reflective film was formed on the polished two faces of the resulting single crystal plate, to prepare a Faraday rotator. 20 samples were taken out of the prepared Faraday rotators to evaluate the optical loss against the beam at a wavelength of 1.55 µm. The optical loss of the Faraday rotator was 0.03 to 0.05 dB. In this Example, a Faraday rotator with no Pb content and with low optical loss as a characteristic profile utilizable in optical devices was obtained.

Comparative Example $Gd_2O_3$, $Yb_2O_3$, $Fe_2O_3$, $B_2O_3$, $Bi_2O_3$, and NaOH were charged in a total weight of 2.3 kg in a crucible 4 made of Au. The blended Fe ratio was 15.5 mol %. The blended ratios of B, Bi and Na were 7.0 mol %, 51.6 mol % and 25.4 mol %, respectively. The crucible 4 with the materials charged therein was arranged in an electric furnace. By melting and agitating the materials in the crucible 4 by raising the furnace temperature to 900° C., a homogenous melt 8 was generated. Arranging a CaMgZr-substituted GGG single crystal substrate 10 of a 2-inch diameter onto a fixing device 2, the substrate was charged in a furnace. After the temperature of the melt 8 was lowered down to 770° C., a single face of the substrate 10 was put in contact with the melt 8 to allow epitaxial growth for 40 hours. Consequently, a single crystal film 12 of a film thickness of 500 µm was grown. The single crystal was compositionally analyzed by X-ray fluorescence analysis. The composition was $Bi_{1.00}Gd_{1.70}Yb_{0.30}Fe_{5.00}O_{12}$. Then, the composition was examined in detail by the ICP analysis. It was shown that the chemical formula of the magnetic garnet single crystal was $(BiGdYb)_{2.998}Na_{0.002}Fe_{5.000}O_{12}$.

By subsequently removing the CaMgZr-substituted GGG single crystal substrate 10 by polishing, a Bi-substituted rare-earth iron garnet single crystal plate was obtained. Subsequently, the single crystal plate was polished by wrapping so that the rotation angle thereof toward the beam at a wavelength of 1.55 µm might be 45 deg. Then, a non-reflective film was formed on the polished two faces thereof, to prepare a Faraday rotator. 20 samples were taken out of the prepared Faraday rotators to evaluate the optical loss against the beam at a wavelength of 1.55 µm. The optical loss of the Faraday rotator was at such a large value as about 3 dB. In this Comparative Example, a Faraday rotator with no Pb content was obtained, but the Faraday rotator was at such high optical loss that the Faraday rotator absolutely never had a characteristic profile utilizable in optical devices.

Second Mode for Carrying out the Invention

In accordance with a second mode for carrying out the invention, a method of producing an optical element is described below, using FIG. 1 alike. In the first mode for carrying out the invention, NaOH is used as a starting material for Na. Because $Na_2CO_3$ and $NaHCO_3$ are less hygroscopic than NaOH, they are preferable as a starting material for Na. Since a highly hygroscopic material is weighed with frequent occurrence of an error, the error is a cause of the variation of the Na ratio in a blend material. When the Na ratio varies, for example, the growing temperature, the growth rate of the garnet film and the Na amount in garnet vary, which cause the occurrence of variations in the cracking level in the resulting grown garnet film and in the optical absorption. Additionally, complex oxides such as $NaFeO_2$, $NaBO_2$, $Na_2B_4O_7$, and $NaBiO_3$ are so less hygroscopic that these complex oxides are also suitable as starting materials for Na. Herein, a vast amount of gases such as $CO_2$ is generated from $Na_2CO_3$, by heating and melting a material in blend with $Na_2CO_3$, so that the material frequently blows out of the crucible. Therefore, the starting materials for Na are more preferably NaOH, $NaHCO_3$, $NaFeO_2$, $NaBO_2$, $Na_2B_4O_7$, and $NaBiO_3$.

Example 4

FIG. 1 depicts a part of the process of growing a single crystal in this Example. $Gd_2O_3$, $Yb_2O_3$, $Fe_2O_3$, $B_2O_3$, $Bi_2O_3$, and $Na_2CO_3$ were charged in a total weight of 2.3 kg in a crucible 4 made of Au. The blended Fe ratio was 15.5 mol %. The blended ratios of B, Bi and Na were 7.0 mol %, 51.6 mol % and 25.4 mol %, respectively. The crucible 4 with the materials charged therein was arranged in an electric furnace. By melting and agitating the materials in the crucible 4 by raising the furnace temperature to 900° C., a homogenous melt 8 was generated. Arranging a CaMgZr-substituted GGG single crystal substrate 10 of a 2-inch diameter onto a fixing device 2, the substrate was charged in a furnace. After the temperature of the melt 8 was lowered down to 770° C., a single face of the substrate 10 was put in contact with the melt 8 to allow epitaxial growth for 40 hours. Consequently, a single crystal film 12 of a film thickness of 500 µm was grown. The single crystal was compositionally analyzed by X-ray fluorescence analysis. The composition was $Bi_{1.00}Gd_{1.70}Yb_{0.30}Fe_{5.00}O_{12}$. Then, the composition was examined in detail by the ICP analysis. It was shown that the chemical formula of the magnetic garnet single crystal was $(BiGdYb)_{2.998}Na_{0.002}Fe_{5.000}O_{12}$.

By removing the CaMgZr-substituted GGG single crystal substrate 10 by polishing, a Bi-substituted rare-earth iron garnet single crystal plate was obtained. Subsequently, the single crystal plate was thermally treated in reducing atmosphere with 100% nitrogen at 500° C. for 10 hours. Additionally, the single crystal plate was polished by wrapping so that the rotation angle thereof toward the beam at a wavelength of 1.55 μm might be 45 deg. Then, a non-reflective film was formed on the polished two faces of the resulting single crystal plate, to prepare a Faraday rotator. 20 samples were taken out of the prepared Faraday rotators to evaluate the optical loss against the beam at a wavelength of 1.55 μm. The optical loss of the Faraday rotator was 0.04 to 0.06 dB, which was a characteristic profile utilizable as a Faraday rotator.

Example 5

$Gd_2O_3$, $Yb_2O_3$, $Fe_2O_3$, $B_2O_3$, $Bi_2O_3$, and $NaHCO_3$ were charged in a total weight of 2.3 kg in a crucible 4 made of Au. The blended Fe ratio was 15.5 mol %. The blended ratios of B, Bi and Na were 7.0 mol %, 51.6 mol % and 25.4 mol %, respectively. The crucible 4 with the materials charged therein was arranged in an electric furnace. By melting and agitating the materials in the crucible 4 by raising the furnace temperature to 900° C., a homogenous melt 8 was generated. Arranging a CaMgZr-substituted GGG single crystal substrate 10 of a 2-inch diameter onto a fixing device 2, the substrate was charged in a furnace. After the temperature of the melt 8 was lowered down to 770° C., a single face of the substrate 10 was put in contact with the melt 8 to allow epitaxial growth for 40 hours. Consequently, a single crystal film 12 of a film thickness of 500 μm was grown. The single crystal was compositionally analyzed by X-ray fluorescence analysis. The composition was $Bi_{1.00}Gd_{1.70}Yb_{0.30}Fe_{5.00}O_{12}$. Then, the composition was examined in detail by the ICP analysis. It was shown that the chemical formula of the magnetic garnet single crystal was $(BiGdYb)_{2.998}Na_{0.002}Fe_{5.000}O_{12}$.

By removing the CaMgZr-substituted GGG single crystal substrate 10 by polishing, then, a Bi-substituted rare-earth iron garnet single crystal plate was obtained. Subsequently, the single crystal plate was thermally treated in reducing atmosphere with 100% nitrogen at 500° C. for 10 hours. Additionally, the single crystal plate was polished by wrapping so that the rotation angle thereof toward the beam at a wavelength of 1.55 μm might be 45 deg. Then, a non-reflective film was formed on the polished two faces of the resulting single crystal plate, to prepare a Faraday rotator. 20 samples were taken out of the prepared Faraday rotators to evaluate the optical loss against the beam at a wavelength of 1.55 μm. The optical loss of the Faraday rotator was 0.04 to 0.06 dB, which was a characteristic profile utilizable as a Faraday rotator.

Example 6

$Gd_2O_3$, $Yb_2O_3$, $NaFeO_2$, $NaBO_2$, $Bi_2O_3$, and $NaBiO_3$ were charged in a total weight of 2.3 kg in a crucible 4 made of Au. The blended Fe ratio was 15.5 mol %. The blended ratios of B, Bi and Na were 7.0 mol %, 51.6 mol % and 25.4 mol %, respectively. The crucible 4 with the materials charged therein was arranged in an electric furnace. By melting and agitating the materials in the crucible 4 by raising the furnace temperature to 900° C., a homogenous melt 8 was generated. Arranging a CaMgZr-substituted GGG single crystal substrate 10 of a 2-inch diameter onto a fixing device 2, the substrate was charged in a furnace. After the temperature of the melt 8 was lowered down to 770° C., a single face of the substrate 10 was put in contact with the melt 8 to allow epitaxial growth for 40 hours. Consequently, a single crystal film 12 of a film thickness of 500 μm was grown. The single crystal was compositionally analyzed by X-ray fluorescence analysis. The composition was $Bi_{1.00}Gd_{1.70}Yb_{0.30}Fe_{5.00}O_{12}$. Then, the composition was examined in detail by the ICP analysis. It was shown that the chemical formula of the magnetic garnet single crystal was $(BiGdYb)_{2.998}Na_{0.002}Fe_{5.000}O_{12}$.

By removing the CaMgZr-substituted GGG single crystal substrate 10 by polishing, then, a Bi-substituted rare-earth iron garnet single crystal plate was obtained. Subsequently, the single crystal plate was thermally treated in reducing atmosphere with 100% nitrogen at 500° C. for 10 hours. Additionally, the single crystal plate was polished by wrapping so that the rotation angle thereof toward the beam at a wavelength of 1.55 μm might be 45 deg. Then, a non-reflective film was formed on the polished two faces of the resulting single crystal plate, to prepare a Faraday rotator. 20 samples were taken out of the prepared Faraday rotators to evaluate the optical loss against the beam at a wavelength of 1.55 μm. The optical loss of the Faraday rotator was 0.04 to 0.06 dB, which was a characteristic profile utilizable as a Faraday rotator.

What is claimed is:

1. A method of producing an optical element comprising:
    growing a garnet single crystal by using a solution containing Na, Bi and B,
    thermally treating the garnet single crystal in reducing atmosphere, and
    preparing an optical element by using the thermally treated garnet single crystal.

2. A method of producing an optical element according to claim 1, where the reducing atmosphere is generated by using an inactive gas and/or a reducing gas.

3. A method of producing an optical element according to claim 2, where the inactive gas includes nitrogen gas.

4. A method of producing an optical element according to claim 2, where the reducing gas includes hydrogen gas.

5. A method of producing an optical element according to claim 1, where the garnet single crystal contains Na.

6. A method of producing an optical element according to claim 5, where the Na in the solution is obtained by melting at least one of NaOH, $Na_2CO_3$, $NaHCO_3$, $NaFeO_2$, $NaBO_2$, $Na_2B_4O_7$, and $NaBiO_3$.

7. A method of producing an optical element according to claim 5, where the Na in the solution is obtained by melting at least one of NaOH, $NaHCO_3$, $NaFeO_2$, $NaBO_2$, $Na_2B_4O_7$, and $NaBiO_3$.

* * * * *